(12) United States Patent
Whelan

(10) Patent No.: US 9,195,733 B2
(45) Date of Patent: Nov. 24, 2015

(54) CLUSTERING WITH VIRTUAL ENTITIES USING ASSOCIATIVE MEMORIES

(71) Applicant: The Boeing Company, Chicago, IL (US)

(72) Inventor: John Desmond Whelan, Seattle, WA (US)

(73) Assignee: THE BOEING COMPANY, Chicago, IL (US)

( * ) Notice: Subject to any disclaimer, the term of this patent is extended or adjusted under 35 U.S.C. 154(b) by 247 days.

(21) Appl. No.: 13/964,797

(22) Filed: Aug. 12, 2013

(65) Prior Publication Data

US 2015/0046643 A1 Feb. 12, 2015

(51) Int. Cl.
*G11C 15/04* (2006.01)
*G06F 17/30* (2006.01)
*G11C 15/00* (2006.01)

(52) U.S. Cl.
CPC .......... *G06F 17/30598* (2013.01); *G11C 15/00* (2013.01)

(58) Field of Classification Search
None
See application file for complete search history.

(56) References Cited

U.S. PATENT DOCUMENTS

| 4,144,564 A | 3/1979 | Lamb |
| 4,149,262 A | 4/1979 | Lamb et al. |
| 5,014,327 A | 5/1991 | Potter et al. |
| 2009/0083207 A1 | 3/2009 | Aparicio, IV |
| 2010/0205192 A1* | 8/2010 | Quadracci et al. ............ 707/758 |

OTHER PUBLICATIONS

Prokopenko et al., "Optimizing Associative Information Transfer Within Content-addressable Memory," International Journal of Unconventional Computation, vol. 4, Issue 3, Special issue: "Towards Theory of Unconventional Computing," 2008, pp. 273-296.

\* cited by examiner

*Primary Examiner* — Kevin Verbrugge
(74) *Attorney, Agent, or Firm* — Yee & Associates, P.C.

(57) ABSTRACT

A system including an associative memory and a first input device in communication with the associative memory. The first input device is configured to receive an attribute value relating to a corresponding attribute of a subject of interest to a user. The system also includes a processor, in communication with the first input device, and configured to generate a first entity using the attribute value. The system also includes an associative memory configured to perform an analogy query using the entity to retrieve a second entity whose attributes match some attributes of the first entity. The associative memory is further configured to cluster first data in the first entity and second data in the second entity.

20 Claims, 11 Drawing Sheets

| PERSPECTIVE: | PARTS |
|---|---|
| 806 | 804 |

ENTITY: arc-580x — 802

| ATTRIBUTES | |
|---|---|
| SIZE: 564mm | |
| WEIGHT: 2lbs | |
| LOCATION: CABIN | |
| TYPE: ALTIMETER | |
| MANUFACTURER: GE | |
| MODEL: 737, 777 | |
| SERIES: 100, 200 | |
| FACTORY: RENTON | |
| REGION: NW | |
| MATERIAL: PLASTIC, MET | |
| CORROSION RESISTANT | |
| RUST RESISTANT: YES | |
| WATERPROOF: YES | |

ENTITIES LIKE: arc-580x

| SCORE | ENTITY | MATCHING ATTRIBUTES |
|---|---|---|
| 808 | 810 | 812 |
| 1.00 | arh888-110 | TYPE: ALTIMETER, MATERIAL: PLASTIC, MODEL: 737, REGION: NW, FACTORY: RENTON, LOCATION: CABIN |
| 0.98 | 162b789 | TYPE: ALTIMETER, MATERIAL: PLASTIC, MODEL: 737, LOCATION: CABIN, FACTORY: RENTON |
| 0.98 | pbx5252-1 | TYPE: ALTIMETER, MATERIAL: PLASTIC, MODEL: 737, LOCATION: CABIN, SERIES: 100 |
| 0.96 | x1535-110 | TYPE: ALTIMETER, LOCATION: CABIN, SIZE :~564mm, MATERIAL: PLASTIC |
| 0.82 | s13a160-1 | TYPE: ALTIMETER, MANUFACTURER: GE, MATERIAL: PLASTIC |
| 0.82 | ax05021 | LOCATION: CABIN, MANUFACTURER: GE, MODEL: 737 |
| ○○○ | ○○○ | ○○○ |

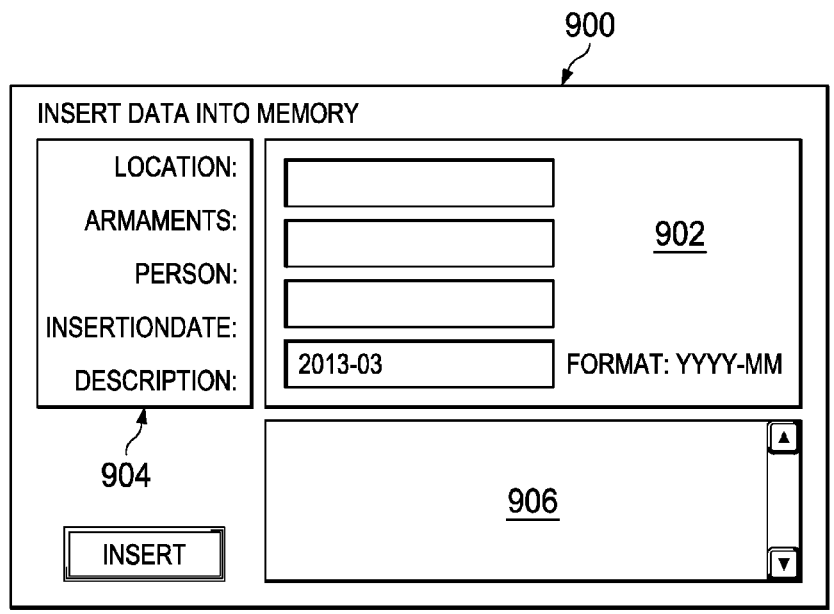

FIG. 9

| ENTITIES LIKE: RIFLE | | |
|---|---|---|
| SCORE | ARMAMENTS | COMMON ATTRIBUTES |
| 1.00 | MORTAR | COMPANY; PLATOON; BATTALION; TEAM; SUPPORT; PROVIDE; ASSAULT; MTOE; [...] |
| 0.95 | DIRECT FIRE | SOLDIER; COMPANY; PLATOON; OPERATION; BATTALION; SUPPORT; DISMOUNT; DEPLOY; [...] |
| 0.95 | ARTILLERY | UNIT; PLATOON; SUPPORT; COMPANY; OPERATION; BATTALION; SOLDIER; ASSAULT; [...] |
| 0.91 | IED | SOLDIER; PATROL; COMPANY; OPERATION; SUPPORT; INCLUDE; UNIT; TEAM; [...] |
| 0.91 | WEAPON | SOLDIER; PATROL; OPERATION; PLATOON; COMPANY; EQUIPMENT; DISMOUNT; UNIT; [...] |
| 0.91 | GUN | PLATOON; COMPANY; OPERATION; TEAM; PATROL; SQUAD; SOLDIER; ASSAULT; [...] |
| 0.82 | 60mm | PATROL; TEAM; PROVIDE; ASSETS; COMPANY; PLATOON; BATTALION; SUPPORT; [...] |
| ○○○ | ○○○ | ○○○ |

FIG. 10

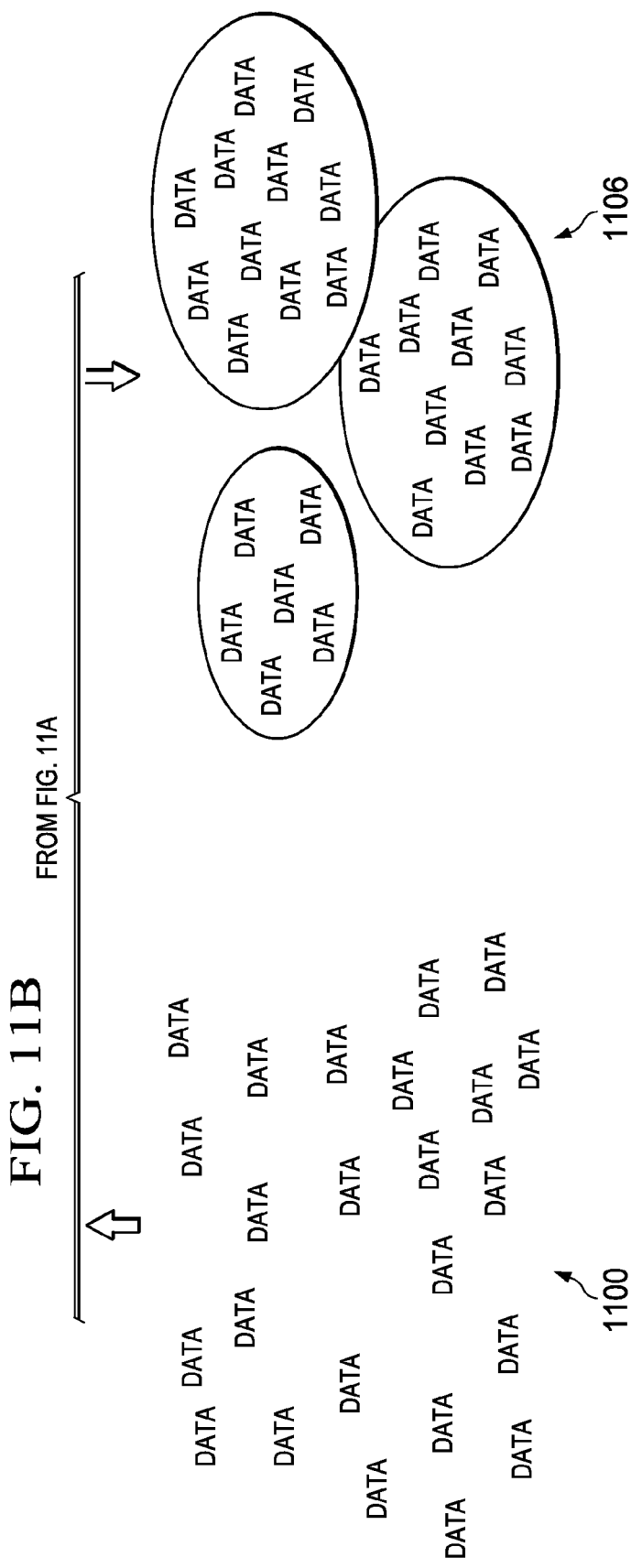

CLUSTERING WITH VIRTUAL ENTITIES USING ASSOCIATIVE MEMORIES

BACKGROUND INFORMATION

1. Field

The present disclosure relates generally to associative memories and, in particular, a system and method for clustering data using associative memory technology.

2. Background

Clustering is a technique used in data management, mining, or interpretation. Data is clustered into related groups in a manner that makes managing, mining, or interpreting the data easier or more understandable. Clustering may be used to group objects together that share similar characteristics in order to learn something about those objects. Thus, clustering allows a user to study data from a different perspective by observing relationships among objects in the cluster.

However, problems can arise when performing clustering. For example, a clustering algorithm may return a group of objects that do not immediately appear to have any relationship to each other. In other words, the relationship or relationships that caused the objects to be grouped together may be hidden to a user, either because the data has a hidden relationship or because the user does not adequately understand the data. As a result, the user may not achieve a desired understanding of the data. Likewise, a user may not be able to name adequately a particular cluster or to identify the group to which the clustered objects belong. In another example, the relationships among objects in the underlying data may not be clearly specified, meaning that the attributes which connect clusters together may be inadequate for the user's purposes. Accordingly, the result of clustering may appear confusing to a user, and the user may not understand why the results are confusing.

Inadequacies in clustering usually are derived from either confused or complicated data, or the user's inability to understand the data once presented. Techniques for overcoming or mitigating these inadequacies are desirable.

SUMMARY

The illustrative embodiments provide for a system. The system includes an associative memory comprising a plurality of data and a plurality of associations among the plurality of data, wherein the plurality of data is collected into associated groups, wherein the associative memory is configured to be queried based on at least indirect relationships among the plurality of data. The system also includes a first input device in communication with the associative memory. The first input device is configured to receive an attribute value relating to a corresponding attribute of a subject of interest to a user. The system also includes a processor, in communication with the first input device, and configured to generate a first entity using the attribute value. The system also includes an associative memory configured to perform an analogy query using the first entity to retrieve a second entity having a second attribute value that matches the first attribute value of the first entity. The associative memory is further configured to cluster first data in the first entity and second data in the second entity.

The illustrative embodiments also provide for a method implemented using a processor in conjunction with an associative memory embodied as a program code on a non-transitory computer readable storage medium, wherein the associative memory comprises a plurality of data and a plurality of associations among the plurality of data, wherein the plurality of data is collected into associated groups, wherein the associative memory is configured to be queried based on at least indirect relationships among the plurality of data. The method includes receiving, in the associative memory, a first entity whose attribute value relates to a corresponding attribute of a subject of interest to a user. The method also includes performing, using the associative memory and the processor, an analogy query using the first entity to retrieve a second entity whose attributes match some attributes of the first entity. The method also includes clustering, using the associative memory and the processor, first data in the first entity and second data in the second entity.

The illustrative embodiments also provide for a computer. The computer includes a processor, a bus connected to the processor, and a non-transitory computer readable storage medium connected to the bus. The non-transitory computer readable storage medium stores an associative memory comprising a plurality of data and a plurality of associations among the plurality of data, wherein the plurality of data is collected into associated groups, wherein the associative memory is configured to be queried based on at least indirect relationships among the plurality of data. The non-transitory computer readable storage medium further stores program code. The program code is configured to receive, in the associative memory, a first entity whose attribute value relates to a corresponding attribute of a subject of interest to a user. The program code is configured to perform, using the associative memory and the processor, an analogy query using the first entity to retrieve a second entity whose attributes match some attributes of the first entity. The program code is configured to cluster, using the associative memory and the processor, first data in the first entity and second data in the second entity.

The features and functions can be achieved independently in various embodiments of the present disclosure or may be combined in yet other embodiments in which further details can be seen with reference to the following description and drawings.

BRIEF DESCRIPTION OF THE DRAWINGS

The novel features believed characteristic of the illustrative embodiments are set forth in the appended claims. The illustrative embodiments, however, as well as a preferred mode of use, further objectives and features thereof, will best be understood by reference to the following detailed description of an illustrative embodiment of the present disclosure when read in conjunction with the accompanying drawings, wherein:

FIG. 8 is a diagram illustrating an analogy query in an associative memory, in accordance with an illustrative embodiment;

FIG. 9 is a diagram illustrating an example of a selection of desirable attribute values for a virtual entity, in accordance with an illustrative embodiment;

FIG. 10 is a diagram illustrating an example of results of an analogy query, in accordance with an illustrative embodiment;

FIGS. 11A and 11B are an abstract diagram illustrating a process of clustering using virtual entities with an associative memory, in accordance with an illustrative embodiment.

DETAILED DESCRIPTION

Figure 1:
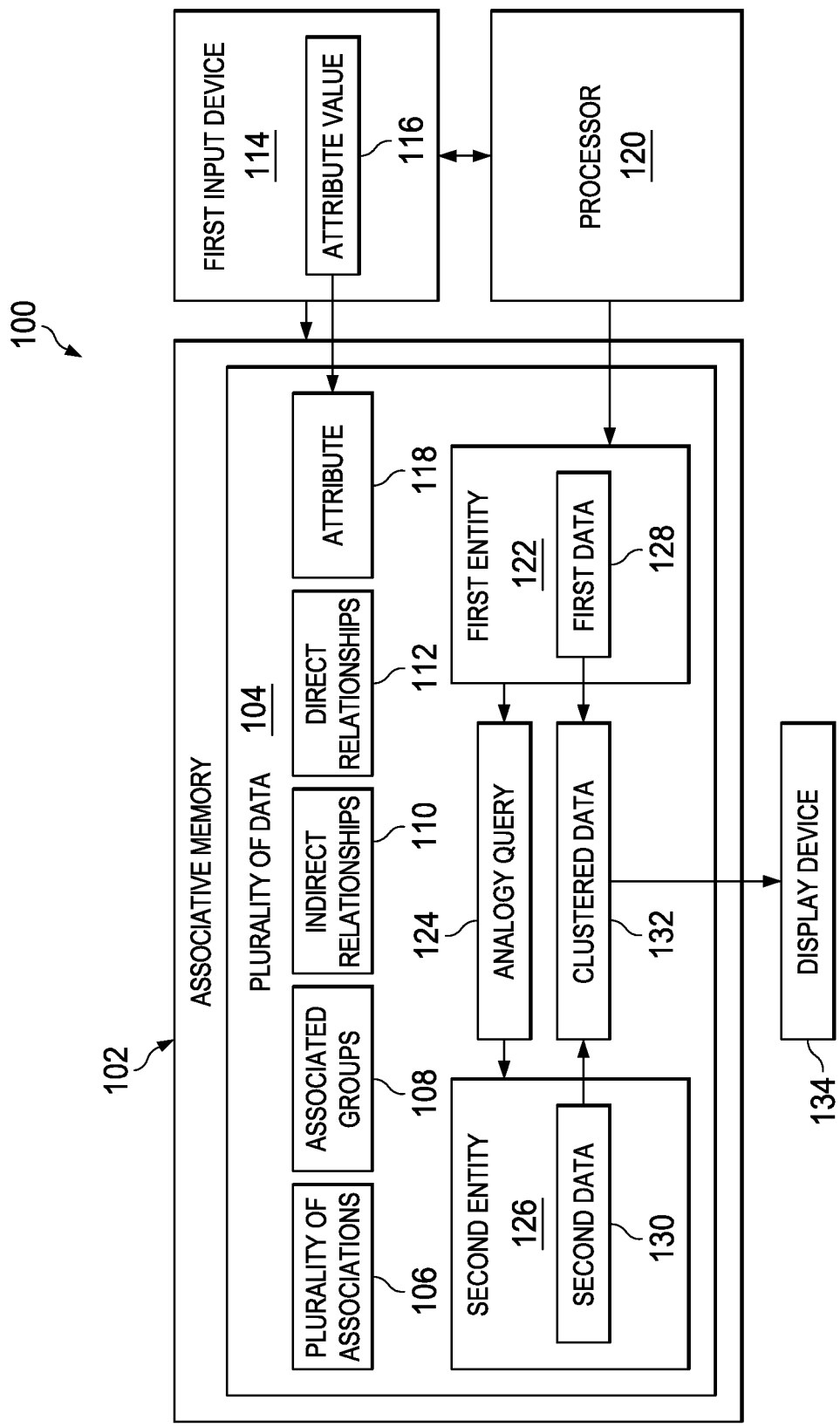
FIG. 1 is an illustration of a block diagram of a system for clustering using entities and an associative memory, in accordance with an illustrative embodiment.

The illustrative embodiments provide several useful functions. For example, the illustrative embodiments recognize and take into account that confusion can arise when cluster results are received. For example, many unidentified clusters can emerge, making proper classification difficult for the user. This effect may be particularly troublesome with complex datasets or advanced domains. As a result, the unidentified clusters may be useless to a user because the user may have no idea what attribute or attributes bound the unidentified clusters together in the first place. A subject matter expert (SME) may try to determine how to classify them, but a subject matter expert may not be available or the skills of the subject matter expert may be better allocated elsewhere. Furthermore, associative memories may complicate the situation further, as some subject matter experts may not be familiar with the structure and format of associative memories.

The illustrative embodiments also recognize and take into account the advantages of associative memories when performing clustering. For example, the illustrative embodiments allows a user to insert data, whether it exists or not, into an associative memory as a virtual entity and create clusters around that entity in order to identify information that would otherwise be difficult to obtain.

The illustrative embodiments provide for inserting an entity, either virtual or real, into an associative memory via an interface. This interface can vary in scope and functionality, but preserves the job of defining the insertion in whatever capability the associative memory can handle. The illustrative embodiments use the inserted entity to allow a user to describe what he or she is looking for. The associative memory may then cluster data based on the attributes or characteristics of the inserted entity.

The illustrative embodiments also provide a quick way for users to cluster unfamiliar data. Unlike traditional searches, the searching performed using the illustrative embodiments may include a context.

The illustrative embodiments may exploit important aspects of the data itself when selecting which attribute categories and values to use when creating clusters. The illustrative embodiments may incorporate knowledge from subject matter experts through the use of additional criteria.

The illustrative embodiments may include a mechanism or process for introducing unreal data into a memory without causing harm. The illustrative embodiments may allow users to locate clusters that may or may not exist.

The illustrative embodiments may provide another way to search complex data without necessarily understanding the entire dataset. The illustrative embodiments may provide a method for users to cluster previously unobtainable information through the use of virtual entities. Thus, the illustrative embodiments may be subject matter independent and universally deployable.

The illustrative embodiments do not necessarily require an exhaustive search of the entire data set. That exhaustive search may have been performed when the data was ingested in the associative memory.

As used herein, the term "associative memory" refers to a plurality of data and a plurality of associations among the plurality of data. The plurality of data and the plurality of associations may be stored in a non-transitory computer readable storage medium. The plurality of data may be collected into associated groups. The associative memory may be configured to be queried based on at least indirect relationships among the plurality of data in addition to direct correlations among the plurality of data. Thus, an associative memory may be configured to be queried based solely on direct relationships, based solely on at least indirect relationships, as well as based on combinations of direct and at least indirect relationships.

Thus, an associative memory may be characterized as a plurality of data and a plurality of associations among the plurality of data. The plurality of data may be collected into associated groups. Further, the associative memory may be configured to be queried based on at least one relationship, selected from a group that includes direct and at least indirect relationships, or from among the plurality of data in addition to direct correlations among the plurality of data. An associative memory may also take the form of software. Thus, an associative memory also may be considered a process by which information is collected into associated groups in the interest of gaining new insight based on relationships rather than direct correlation. An associative memory my also take the form of hardware, such as specialized processors or a field programmable gate array.

As used herein, the term "entity" refers to an object that has a distinct, separate existence, though such existence need not be a material existence. Thus, abstractions and legal constructs may be regarded as entities. As used herein, an entity need not be animate.

As used herein, unless specified otherwise, the term "entity comparison" refers solely to an aspect of an associative memory. An entity comparison is used to identify similarities between one or more first entities stored in the associative memory and one or more second entities stored in the associative memory based on the matching attributes of each entity.

FIG. 1 is an illustration of a block diagram of a system for clustering using entities and an associative memory, in accordance with an illustrative embodiment. System 100 of FIG. 1 may be implemented using a data processing system, such as system 1200 of FIG. 12. System 100 may include associative memory 102. Associative memory 102 may be associative memory 1228 of FIG. 12. An associative memory may be embodied as a non-transitory computer readable storage medium storing program code, or may be implemented as hardware such as in an application specific integrated circuit.

Specifically, associative memory 102 may include plurality of data 104 and plurality of associations 106 among the plurality of data, wherein plurality of data 104 is collected into associated groups 108. Associative memory 102 may be configured to be queried based on at least indirect relationships 110 among plurality of data 104, but may also be configured to be queried based on direct relationships 112 among plurality of data 104.

System 100 may also include first input device 114 in communication with associative memory 102. First input device 114 may be a tangible thing configured to receive user input. First input device 114 allows the user to introduce a new, possibly virtual, entity into the system. First input device 114 may be configured to receive one or both of structured data and unstructured data. First input device 114 may be configured to receive attribute value 116 relating to corresponding attribute 118 of a subject of interest to a user.

System 100 may also include processor 120. Processor 120 may be in communication with first input device 114. Processor 120 may be configured to generate first entity 122 using attribute value 116. Processor 120 may be configured to generate first entity 122 either because the processor is an application specific integrated circuit (ASIC) or because the processor is executing an algorithm to generate first entity 122, or a combination of both. In any case, first entity 122 is generated based on data received from first input device 114, and thus, for example, first entity 122 may be generated based on attribute value 116. Once processor 120 generates first entity 122, processor 120 may be configured to insert first entity 122 into associative memory 102. Thus, first entity 122 also may be called an "insertion entity."

Associative memory 102 may be configured to perform analogy query 124 using first entity 122 to retrieve second entity 126 whose attributes match some attributes of first entity 122. Associative memory 102 may be further configured to cluster first data 128 in first entity 122 and second data 130 in second entity 126. The result may be clustered data 132. The data that is clustered is the entire dataset which resides in the relevant domain. The criteria for the cluster is selected by the user via providing attribute value 116, and possibly additional attribute values.

In an illustrative embodiment, first entity 122 may be a real entity that reflects a real object with real attributes. However, in another illustrative embodiment, first entity 122 may be a virtual entity. A virtual entity may be an imaginary entity conceived by a user. The virtual entity may have no real existence.

Thus, the virtual entity may be an object having ideal properties not achievable in real existence. In another example, the virtual entity may be a flawless solution to a problem.

Nevertheless, even if first entity 122 is a virtual entity, the result of performing the clustering may represent a real result. For example, if first entity 122 represents a flawless solution to a problem, then second entity 126 may be at least one real solution to the problem. While this real solution or solutions may not be flawless, it may provide the user with at least some solution or suggestions for a solution that the user may not have been able to conceive on his or her own.

Continuing this example, associative memory 102 may be configured to produce clustered data 132 as a result of clustering. In this case, system 100 further may include display device 134 in communication with associative memory 102. Display device 134 may be configured to display clustered data 132 such that attributes of the real solution are visibly compared to attributes of the flawless solution.

In another illustrative embodiment, attribute value 116 may be a plurality of attribute values within an entity, which may be a virtual entity. In this case, associative memory 102 further may be configured to select which attributes of the plurality of attributes to use when making a comparison.

In still another illustrative embodiment, first input device 114 further may be configured to receive comparison criteria. In this case, associative memory 102 further may be configured to modify which attributes associative memory 102 uses when generating a comparison.

The illustrative embodiments described with respect to system 100 may be varied. For example, system 100 may instead be a computer. Such a computer may be represented by FIG. 12, and may include a processor, a bus connected to the processor, and a non-transitory computer readable storage medium connected to the bus. The non-transitory computer readable storage medium may store associative memory 102. The non-transitory computer readable storage medium further may store program code that implements the processes and devices described above with respect to system 100.

Other variations are possible. For example, a user or associative memory 102 may input multiple entities instead of just a single entity 116. The result of analogy query 124 may return more than one additional entity, other than second entity 126. Clustered data 132 may represent data from multiple entities clustered about a single entity, such as first entity 122. Clustered data 132 may represent data from multiple entities clustered about multiple other entities. Thus, the illustrative embodiments described above do not necessarily limit the claimed inventions.

Still other variations are possible. For example, the illustrative embodiments shown in FIG. 1 are not meant to imply physical or architectural limitations to the manner in which different illustrative embodiments may be implemented. Other components in addition to and/or in place of the ones illustrated may be used. Some components may be unnecessary in some illustrative embodiments. Also, the blocks are presented to illustrate some functional components. One or more of these blocks may be combined and/or divided into different blocks when implemented in different illustrative embodiments.

Figure 2:
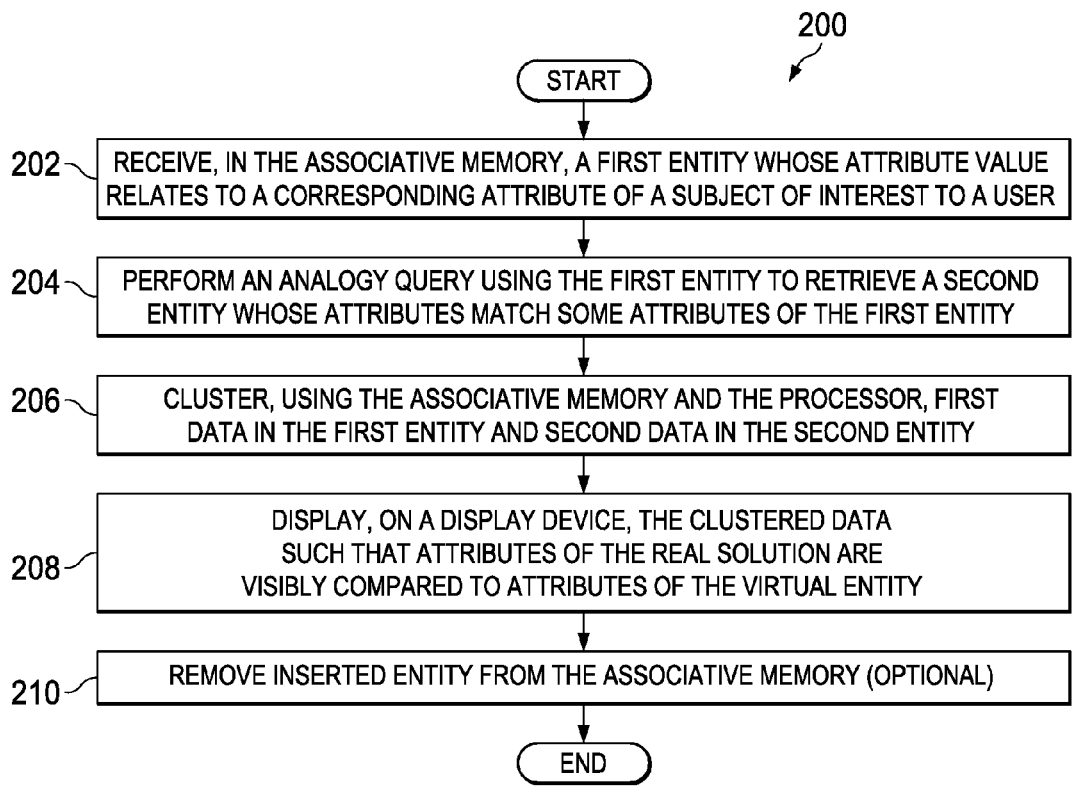
FIG. 2 is a flow chart of a process for clustering using entities and an associative memory, in accordance with an illustrative embodiment.

FIG. 2 is a flow chart of a process for clustering using entities and an associative memory, in accordance with an illustrative embodiment. Method 200 may be implemented using an associative memory, such as associative memory 102 of FIG. 1. Method 200 may be implemented by system 100 of FIG. 1. Method 200 may be implemented by data processing system 1200 of FIG. 12. With respect to FIG. 2, a "process" is described as performing an action. As used herein, a "process" is considered to be a non-transitory processor or other physical device configured to perform the action described, or may be considered to be a non-transitory computer readable storage medium storing computer usable program code configured, when executed, to carry out the action described. Thus, the term "process" refers to one or more real, physical devices configured to perform the functions or operations described. The term "process" may refer to an associative memory.

Method 200 may be implemented using a processor in conjunction with an associative memory embodied as a program code on a non-transitory computer readable storage medium. The associative memory may be a plurality of data and a plurality of associations among the plurality of data. The plurality of data may be collected into associated groups. The associative memory may be configured to be queried based on at least indirect relationships among the plurality of data.

Method 200 may begin as the process receives, in the associative memory, a first entity whose attribute value relates to a corresponding attribute of a subject of interest to a user (operation 202).

The process may then, using the associative memory and the processor, perform an analogy query using the first entity to retrieve a second entity whose attributes match some attributes of the first entity (operation 204).

The process may then cluster, using the associative memory and the processor, first data in the first entity and second data in the second entity (operation 206). In one illustrative embodiment the process may terminate thereafter.

However, method 200 may be further varied. For example, the entity comprises a virtual entity. In this case, the virtual entity may be an object having ideal properties not achievable in real existence. In another illustrative embodiment, the second entity may be at least one real solution to the problem.

In still another illustrative embodiment, the associative memory may be configured to produce clustered data as a result of clustering. In this case, method 200 may also optionally include displaying, on a display device, the clustered data such that attributes of the real solution are visibly compared to attributes of the virtual entity (operation 208). The process may terminate thereafter.

Optionally, the inserted entity may be removed from the associative memory (operation 210). In other words, the inserted data can be removed from the system if so desired by the user. Since virtual entities are only introduced to the memory and are not a part of the original source data, they can easily be erased if necessary or desired.

Still other variations are possible, as discussed with respect to system 100 of FIG. 1. Thus, the illustrative embodiments shown in FIG. 2 are not meant to imply physical or architectural limitations to the manner in which different illustrative embodiments may be implemented. Other components in addition to and/or in place of the ones illustrated may be used. Some components may be unnecessary in some illustrative embodiments. Also, the blocks are presented to illustrate some functional components. One or more of these blocks may be combined and/or divided into different blocks when implemented in different illustrative embodiments.

Figure 3:
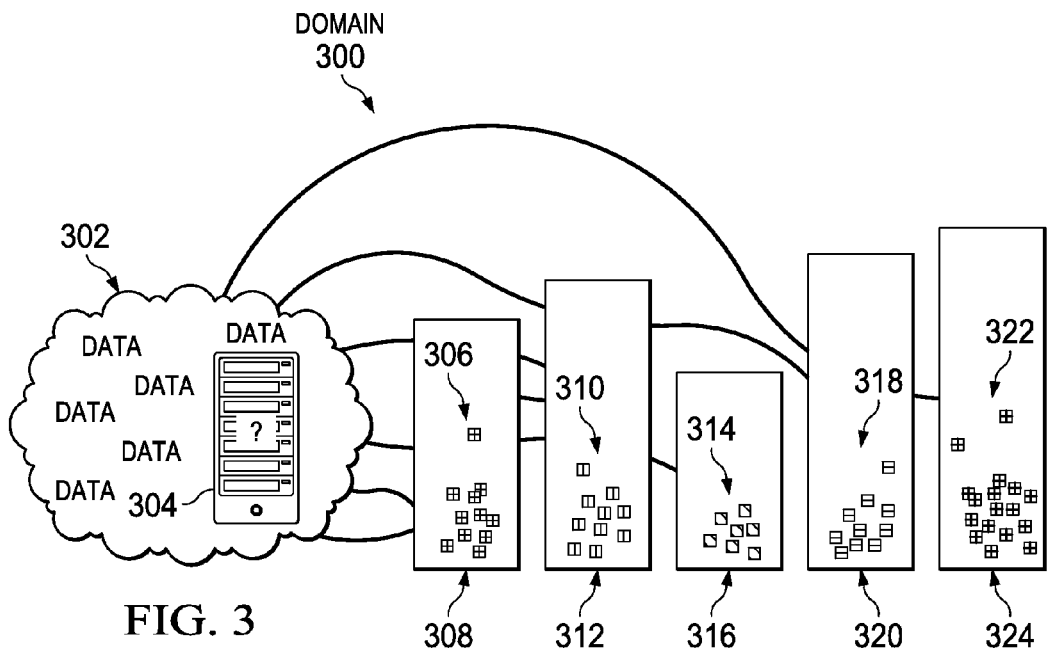
FIG. 3 is an abstract diagram illustrating data clustering, in accordance with an illustrative embodiment.

FIG. 3 is an abstract diagram illustrating data clustering, in accordance with an illustrative embodiment. FIG. 3 shows a result of the operations described with respect to FIG. 1 and the functions of FIG. 2, particularly showing the result of clustered data 132 of FIG. 1. The purpose of FIG. 3 is to demonstrate clustering in a general sense.

Broadly, the illustrative embodiments use the insertion of entities, virtual or otherwise, within an associative memory, to cluster similar entities in order to identify information that would otherwise be difficult to uncover. Again, an associative memory is a program or process by which information is collected into associated groups in the interest of gaining new insight based on relationships rather than direct correlation.

Clustering may be described as the task of grouping a set of objects in such a way that objects in the same group are more similar to each other than to those in other groups. Thus, for example, data that are related to each other may be placed in similar categories. FIG. 3 demonstrates this concept.

Domain 300 represents a domain in an associative memory. Domain contains data 302. Query 304 is made using data 302. The result of query 304 may be to cluster data in categories relating to one or more attributes the user specifies. Thus, data 306 may all have similar characteristics and are placed into category 308. Likewise, data 310 is placed into category 312, data 314 is placed into category 316, data 318 is placed into category 320, and data 322 is placed into category 324.

A user may examine the contents of one or more of these categories. For example, if a user wishes to try to gain insight regarding a subject, a user may wish to determine what data is related to a particular attribute, and thus may examine all data within a particular category. The illustrative embodiments use this clustering concept.

Figure 4:
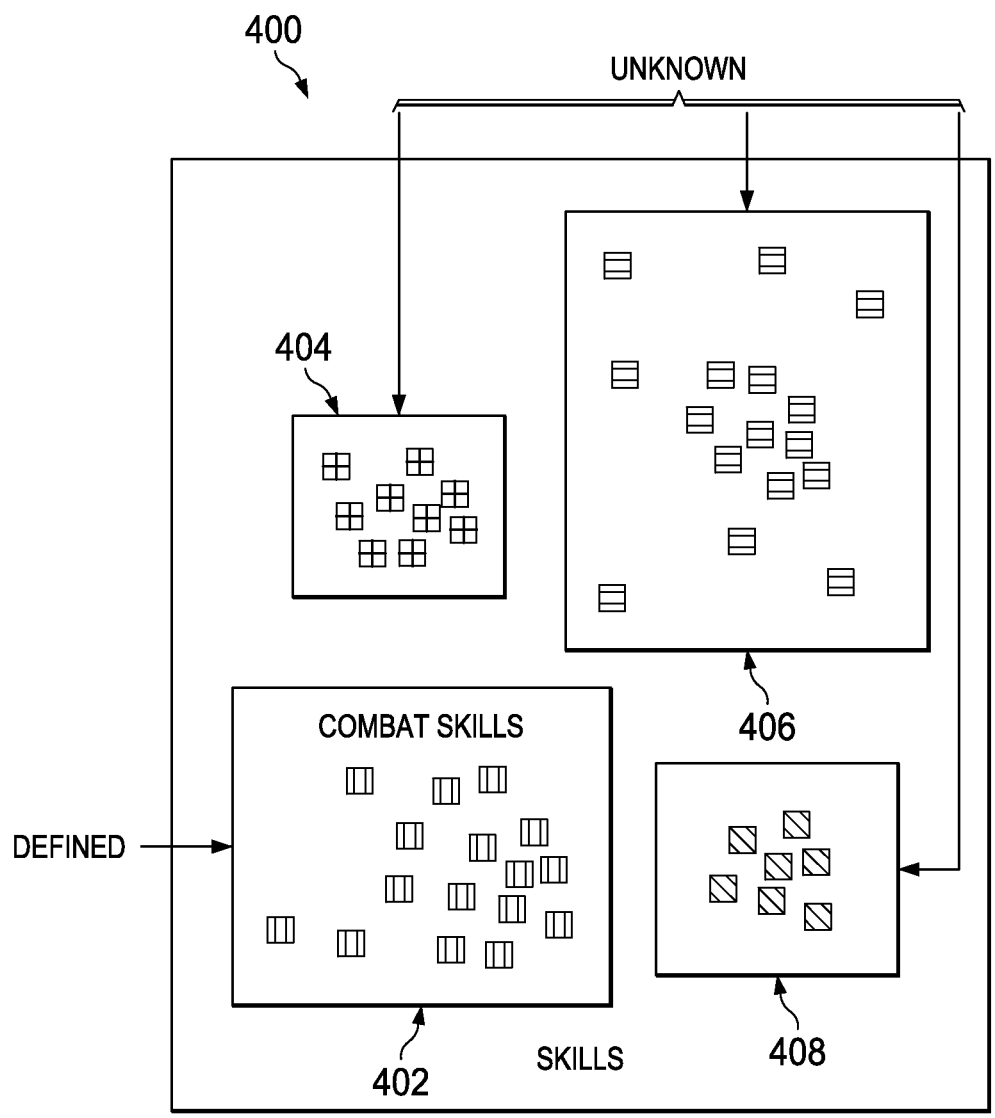
FIG. 4 is a diagram illustrating an example of unidentified clusters, in accordance with an illustrative embodiment.

FIG. 4 is a diagram illustrating an example of unidentified clusters, in accordance with an illustrative embodiment. FIG. 4 shows set of cluster results 400. More particularly, FIG. 4 is used to demonstrate the problems with using data clustering as a means of extracting information. These problems are described above, but are further detailed here.

Set of cluster results 400 may include some unidentified categories. Thus, while category 402 is clearly identifiable as "combat skills," category 404, category 406, and category 408 contain data that must be clustered about a common category, but the user may not be able to identify what that category is.

To use a simplistic example, the associative memory may return a result that a particular dog and a particular weapon should be clustered into a single category, such as category 404. However, a user may not be able to appraise what the relationship is between the particular dog and the particular weapon. In some cases, discovering that relationship may be impractical.

Category 404 may represent an unidentified cluster. Category 406 and category 408 may also be unidentified clusters. As described above, unidentified clusters may be of limited value because a user may have no idea what attribute or attributes bound them together in the first place. A subject matter expert may try to determine how to classify them. For example, continuing the example above, a subject matter expert may be a police detective familiar with a case and thus may know that the particular dog and the particular weapon both relate to a particular crime (the category) which he or she is investigating.

However, an associative memory may complicate the difficulties described above as most subject matter experts are not familiar with the structure and format of an associative memory. For example, in a real experiment performed, data from a flight school was examined using clustering and an associative memory in an attempt to classify all the common skills sets of flying into correlating categories. Using conventional clustering techniques, the results contained many clusters that were difficult to characterize, based solely on the skills or attributes contained within. Even a subject matter expert had difficultly classifying the categories.

In extreme cases, the number of unidentified clusters can outnumber the number of identified or known clusters. In these cases, the technique of clustering may be impractical or useless. Furthermore, with clustering in general, specifying a specific result may be difficult. Instead, a user may search through what was clustered in hopes of uncovering that which the user seeks.

Yet further, clustering may require an exhaustive search of the entire data set, regardless of the method used. For very large data sets, such an exhaustive search may not be desirable, sustainable, or even practical. In fact, because cluster results from an associative memory are formulated from attributes of entities, both of which can be abstracted, identification problems occur far more often than with other clustering techniques. The illustrative embodiments described herein address these issues.

The novelty of this invention allows users to insert data, whether it exists or not, into an associative memory as a virtual entity and create clusters around that entity in order to identify information that would otherwise be difficult to obtain.

The illustrative embodiments do not require an exhaustive search of the entire data set. The illustrative embodiments provide a quick way for users to cluster unfamiliar data. Unlike traditional searches, the searching described with respect to the illustrative embodiments includes a context.

The illustrative embodiments may exploit important aspects of the data itself when selecting which attribute categories and values to use when creating clusters. The illustrative embodiments may incorporate knowledge from subject matter experts through the use of additional criteria.

The illustrative embodiments include a mechanism or process for introducing unreal data into a memory without causing harm. Thus, the illustrative embodiments allow a user to locate clusters that may or may not exist.

The illustrative embodiments provide another way to search complex data without necessarily understanding the entire dataset. The illustrative embodiments also provide a method for users to cluster previously unobtainable information through the use of virtual entities. The illustrative embodiments may be subject matter independent and universally deployable.

Figure 5:
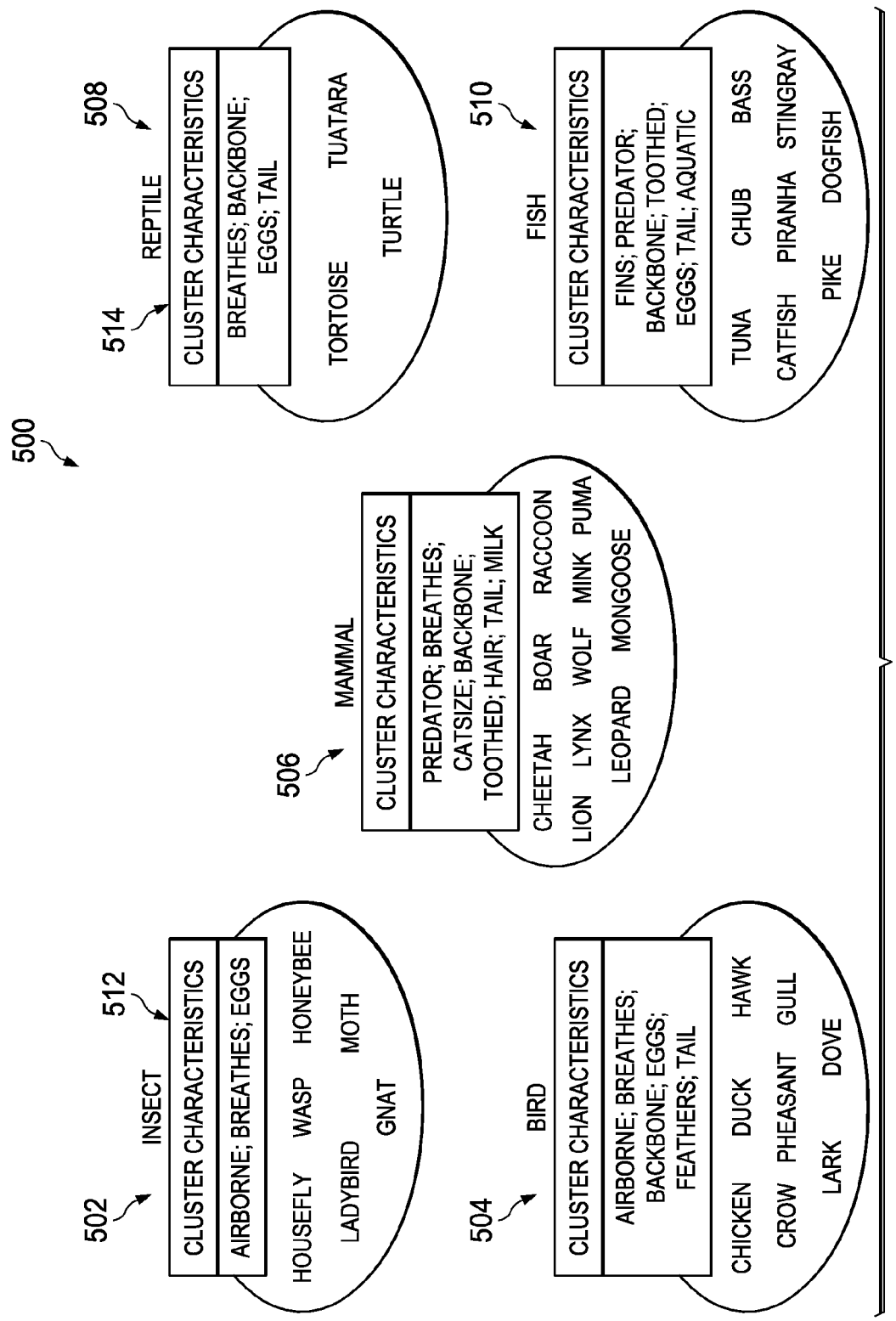
FIG. 5 is a diagram illustrating a specific example of clustering of data, in accordance with an illustrative embodiment.

FIG. 5 is a diagram illustrating a specific example of clustering of data, in accordance with an illustrative embodiment. Data 500 may be data 302 of FIG. 3. Data 500 have been clustered into categories, such as category 502, category 504, category 506, category 508, and category 510. In this particular illustrative embodiment, data 500 relate to animals; however, data 500 could relate to any subject matter and is not limited to animals.

As described above, clustering may be grouping data together that share similar characteristics in order to learn something about them. Clustering may be an iterative process of knowledge discovery. Clustering may allow users to study the data from a different perspective by observing relationships among each cluster.

For example, each of category 502, category 504, category 506, category 508, and category 510 may be characterized as a corresponding cluster. Each category or cluster may represent a unique grouping of animals based on certain characteristics. For example, cluster characteristics 512, taken together, may identify a category 502 as airborne "insects." Airborne insects share the attributes or characteristics of being egg laying, breathing, and airborne. Other characteristics may apply, such as for example, having six legs. Identifying these characteristics within each animal allows the user to determine to which cluster or category a given animal belongs.

However, problems can arise when a user is unable to correctly identify clusters based on the combination of characteristics collected. For instance, if a user were unfamiliar with animals, the user might have a difficult time identifying cluster 508 as being "reptiles" based solely on cluster characteristics 514 that include the attributes of breathing, having a backbone, being egg laying, and possessing a tail (and being cold blooded). Stated differently, a user may not be able to correlate similarities within a cluster in order to understand the cluster. As a result, the outcome of a search or comparison may be subjective or less useful depending on how the returned clustering is interpreted. The illustrative embodiments address problems such as this, as well as other problems identifying categories, characteristics, or members of categories.

Figure 6:
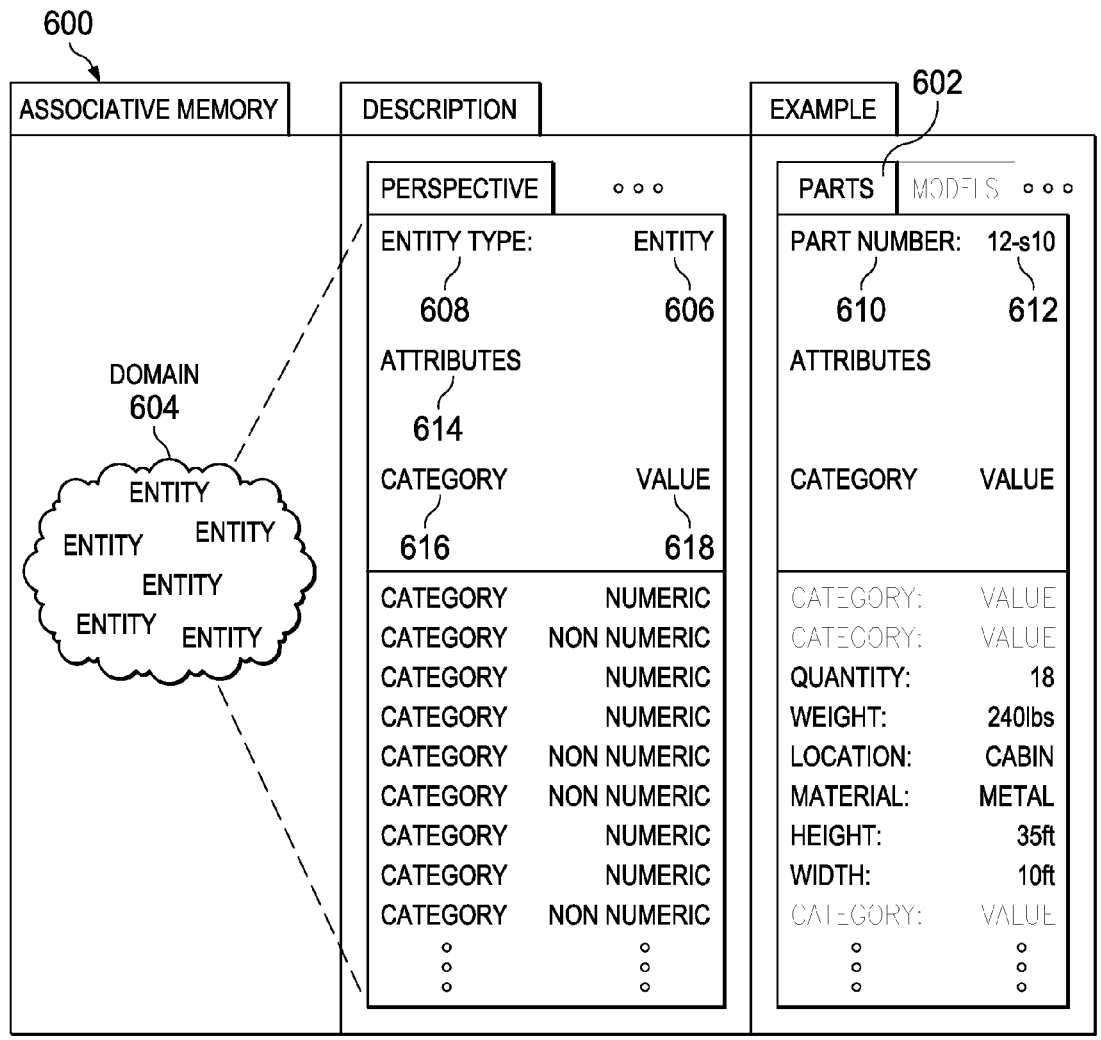
FIG. 6 is a diagram illustrating perspectives, entities, and attributes, in accordance with an illustrative embodiment.

FIG. 6 is a diagram illustrating perspectives, entities, and attributes, in accordance with an illustrative embodiment. Associative memory 600 may be, for example, associative memory 100 of FIG. 1 or associative memory 1228 of FIG. 12. FIG. 6 is used to represent technical aspects of the operation of an associative memory.

An associative memory is defined in detail above, but in brief, an associative memory is a plurality of data and at least indirect relationships among the plurality of data. An associative memory may also refer to a non-transitory computer readable storage medium storing the data and the at least indirect relationships, to software that allows queries of such data and relationships, and a combination thereof.

An associative memory may be logically divided into perspectives. A perspective may provide a point of view or an initial context for a particular aspect of a user's domain. A domain may be a group of data related to each other in some manner. For example, parts 602 could be a perspective within domain 604, with domain 604 representing, for example, a commercial aircraft.

An associative memory may organize data into entities. An entity is an instantiation of an entity type. Thus, entity 606 may be an instantiation of entity type 608. In a specific example, an example of entity type 608 may be Part Number 610. In this case, an example of entity 606 may be an instantiation of that type, namely, "12-s10" 612, which represents a particular part number. Perspectives may represent one or more entity types. This characteristic of perspectives may allow a user to view domain data from a particular perspective that is both beneficial to them and the memory.

Each entity may contain set of attributes 614 used to describe the entity. An associative memory may separate each attribute into a category and its corresponding value, such as the entries in category column 616 and value column 618. An attribute value may be numeric, alphabetic, alpha-numeric, non-numeric, or even possibly picture files or sound files, or other types of data.

Figure 7:
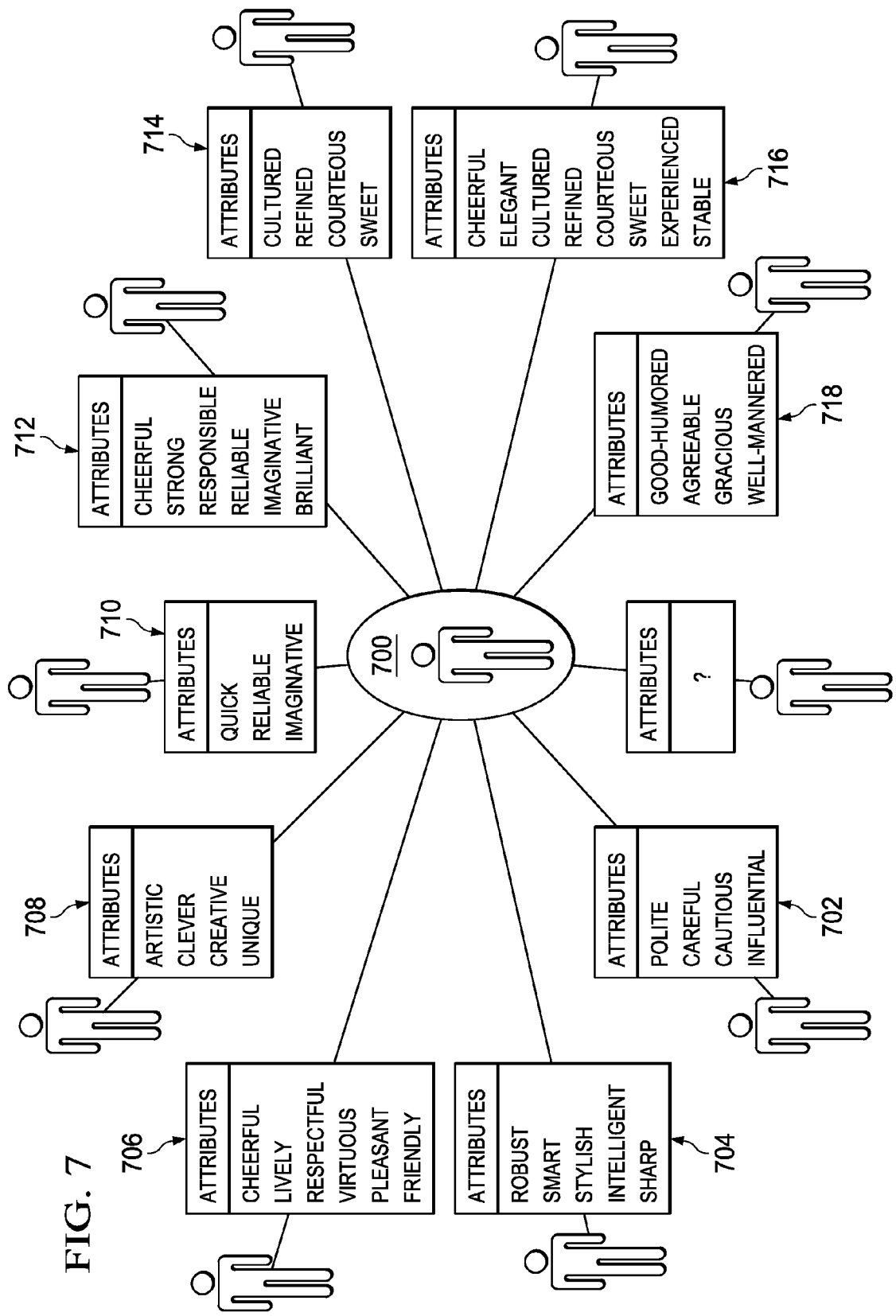
FIG. 7 is an abstract diagram illustrating an example of a virtual entity, in accordance with an illustrative embodiment.

FIG. 7 is an abstract diagram illustrating an example of a virtual entity, in accordance with an illustrative embodiment. Virtual entity 700 may be first entity 122 of FIG. 1. In other words, virtual entity 700 may be an inserted entity. Virtual entity 700 may be the first entity used in operation 202 of FIG. 2. Virtual entity 700 may be replaced by a real entity.

Virtual entity 700, as all virtual entities, may be an entity that has no corresponding real object, but rather represents a user construct defined by a set of characteristics that are provided by the user. For example, a virtual entity may be a part which has perfect characteristics for use in a machine, even though the user knows that having perfect characteristics is not possible. The user may create virtual entity 700 in order to cause an associative memory to cluster data regarding real parts around part characteristics for which the user looks.

Like entities described with respect to FIG. 6, a virtual entity may contain the same or similar structure and context as real entities. However, as described above, virtual entities do not have to actually exist or even be physically possible. Other examples of virtual entities may include a perfect student or a flawless solution.

Virtual entities may allow a user to speculate how something could be varied, without affecting the underlining data, since the virtual entity is only introduced to the associative memory and is not part of the original source data.

A virtual entity may be any entity whose attributes are a combination of real or virtual attributes. A user could select the best or worst attributes of each entity in which the user is interested. The associative memory may also create a virtual entity based on at least one characteristic supplied by the user or some other input provided by the user.

Thus, virtual entity 700 may be a person that does not actually exist, but who has characteristics the user desires to fill a job role. Whether possible or impossible, virtual entity 700 may have all of the characteristics of other real entities representing real persons, such as entity 702, entity 704, entity 706, entity 708, entity 710, entity 712, entity 714, entity 716, and entity 718.

FIG. 8 is a diagram illustrating an example of an analogy query in an associative memory, in accordance with an illustrative embodiment. Results 800 show exemplary results of an analogy query on entity 802, which has entity type "parts" 804 within perspective 806 of an associative memory. Results 800 may represent the results of analogy query 124 of FIG. 1.

An analogy query is defined as a query on an associative memory to return those entities that are similar to a specified entity. Results 800 represent information returned by an associative memory based on a query to search for entities similar to entity 802, which represents part number arc-580x. Results 800 are thus other entities, or part numbers, shown in entity column 810. Score column 818 may represent how closely the corresponding part matches entity 802. Matching attributes column 812 represents those attributes for a given returned entity that match corresponding attributes of entity 802.

As shown in FIG. 8, results 800 may be an ordered list of entities that are like or similar to the original or sought entity within a perspective. As used herein, the terms "like" or "similar to" are defined as returned entities that have a score in score column 808 that is above a pre-defined threshold number. An associative memory may collect some or all of the matching attributes among these entities to formulate the list shown in results 800. The order of that list may depend on the significance of the matching attributes, as represented by the scores in score column 808. The score may correlate to the number of attributes found, but may be weighted by specific attributes deemed to be more important to a user.

An analogy query may be a result of two actions. First, the associative memory may select which of the sought entity's attributes to use, both categories and attribute values. The user can influence this decision by creating comparison criteria or by weighting categories or attribute values. The criteria or weighting may inform the associative memory of which attribute categories to evaluate as being more important when performing the query.

Second, the associative memory or a processor acting on the associative memory may search the data within the associative memory using the attributes collected from the first step. The final result of the search includes entities that have attributes that match or about match the attributes of the sought entity. The term "about match" is defined as matching to a degree representing a pre-determined percentage of match.

In an illustrative embodiment, comparison criteria may be selected by the user or may be pre-defined by the associative memory. In either case, the associative memory may define the comparison criteria's format and usage.

FIG. 9 is a diagram illustrating an example of a selection of desirable attribute values for a virtual entity, in accordance with an illustrative embodiment. Input prompt 900 may represent a prompt presented to a user to input data or characteristics that a user desires a virtual entity or a real insertion entity to have. Thus, input prompt 900 may be an example of part of first input device 114 of FIG. 1. However, first input device 114 of FIG. 1 may be a keyboard, a mouse, a microphone for receiving speech for speech recognition, or another physical device that receives user input and causes that user input to be provided to input prompt 900.

In an illustrative embodiment, a user may be confronted by data that is difficult to cluster or, once clustered, is difficult to understand in terms of understanding the importance of the cluster. For example, suppose a user created a cluster from property data, using information gathered from an assessment survey. When clustering this kind of data, the results could be confusing because the relationships among the properties may not be clearly specified. For example, the data provided by users could leave room for many interpretations. In other words, the attributes which connect each object into a cluster may not describe anything of immediate importance to a user when displayed in totality.

The inability to visualize clusters usually comes from confusing or complicated data or a user's inability to understand the data, or some other source. Whatever the source, a purpose of the illustrative embodiments is to provide users with an alternative when traditional clustering techniques do not provide the capabilities needed.

Returning to FIG. 9, after a user envisions that for which the user is looking, a user may determine the attribute values desired for that visualization. The user may then enter these attribute values into input prompt 900. The process then may use a predetermined attribute to create the entity and also associate all the entered attributes with that entity. This entity then may be inserted into the memory. Data may be entered as structured data in the fields shown in box 902 based on corresponding specific prompt information 904. Data may be entered in box 906 as unstructured data, which may represent any terms a user wishes to enter. Data may also be entered in other forms, such as symbols, pictures, sounds, or other data.

The associative memory may be preconfigured to determine which attribute categories to use within a pre-existing specific domain as it pertains to a particular entity type. These attribute categories may be the elements used to describe that for which the user is looking.

Again, the attribute values entered do not have to be real. The attribute values could be attributes from real objects or be virtual, in order to fit an ideal situation or describe unattainable goals. Whatever the user enters, the associative memory will use the entries to create a virtual entity, using a predetermined attribute. The virtual entity is then inserted into the associative memory for use in the next phase of the process, described below.

In the past, users were discouraged from entering fake or unreal information into a data set because virtual information could corrupt the underlining data. However, with virtual entities, this result is not a concern because virtual entities are only introduced to the associative memory and are not a part of the original source data; they can easily be erased once used.

FIG. 10 is a diagram illustrating an example of results of an analogy query, in accordance with an illustrative embodiment. Results 1000 may be obtained in a manner similar to that described with respect to results 800 of FIG. 8. However, results 1000 are used to aid in describing the next phase of operations after the virtual entity creation phase described above with respect to FIG. 9.

After creating a virtual entity based on at least one characteristic provided by a user, the associative memory may perform an analogy query on the inserted data to retrieve all the entities that match the inserted entity's attributes. In this illustrative embodiment, the returned results are results 1000. The associative memory may select which categories and attribute values to use according to its own hierarchal structure, based on important aspects of the data as determined by the user or by policies set by the user. The user can influence this decision by creating comparison criteria or by weighting data.

Thereafter, the associative memory may use results 1000 of the analogy query to cluster the data. In this manner, the resulting cluster is automatically identified by the user and as a result, easily classified. As soon as the user is finished with the cluster, the user can choose to delete the cluster from the associative memory or keep the cluster in the associative memory.

In other words, a reason why the illustrative embodiments solve the problem of difficult-to-identify clusters is that the user already knows the entity about which the data is clustered. The user also likely knows or has input this entity's characteristics. Thus, when a returned entity is clustered into a particular category, the user should be able to immediately assess why that entity is in a particular category.

Figure 11A:
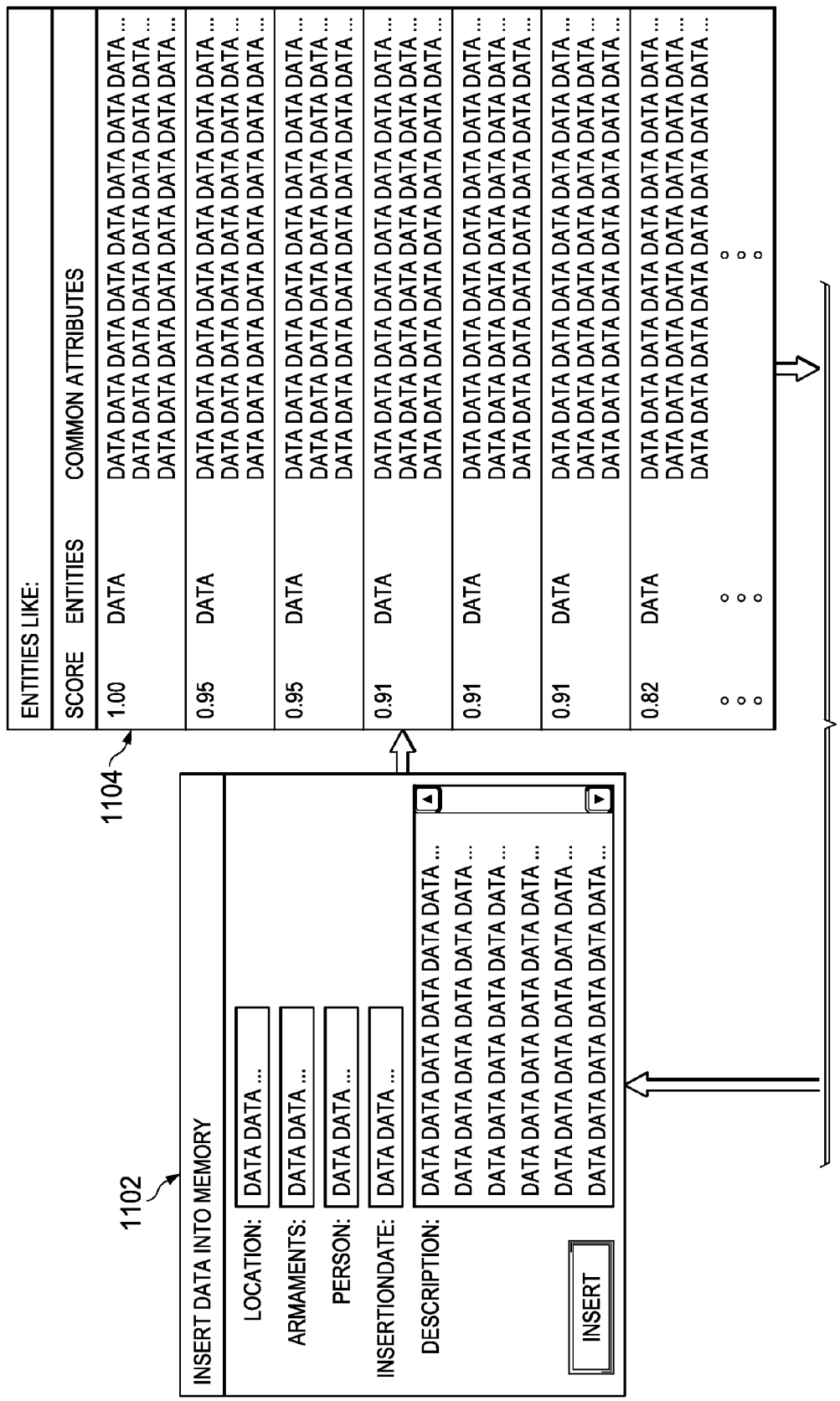

FIGS. 11A and 11B are an abstract diagram illustrating a process of clustering using virtual entities with an associative memory, in accordance with an illustrative embodiment. FIGS. 11A and 11B represent an overview of a process of using system 100 of FIG. 1. FIGS. 11A and 11B represent an alternative representation of the operations shown in FIG. 2. FIGS. 11A and 11B summarize some of the description provided with respect to FIG. 3 through FIG. 10.

With respect to FIGS. 11A and 11B, a "process" is described as performing an action. As used herein, a "process" is considered to be a non-transitory processor or other physical device configured to perform the action described, or may be considered to be a non-transitory computer readable storage medium storing computer usable program code configured, when executed, to carry out the action described. Thus, the term "process" refers to one or more real, physical devices configured to perform the functions or operations described. The term "process" may refer to an associative memory. The associative memory may include data 1100.

Initially, the process receives user provided information, such as via user prompt 1102. The user illustrates what he or she is looking for by entering attribute values into user prompt 1102. These attribute values define that which the user seeks, and will be used to define an insertion entity.

These attribute values do not have to exist, singularly or in totality. If at least some of the attribute values do not exist, then ultimately the process will create a virtual entity.

Then, the process performs an analogy query on the inserted data to retrieve all the entities that match or about match the inserted entity's attributes, as shown at results 1104. The process uses results 1104 to cluster the data, as shown at clusters 1106. The user then uses the clustered data in a manner of interest to the user. Once finished, the user can delete the cluster from the memory or choose to keep it.

Figure 12:
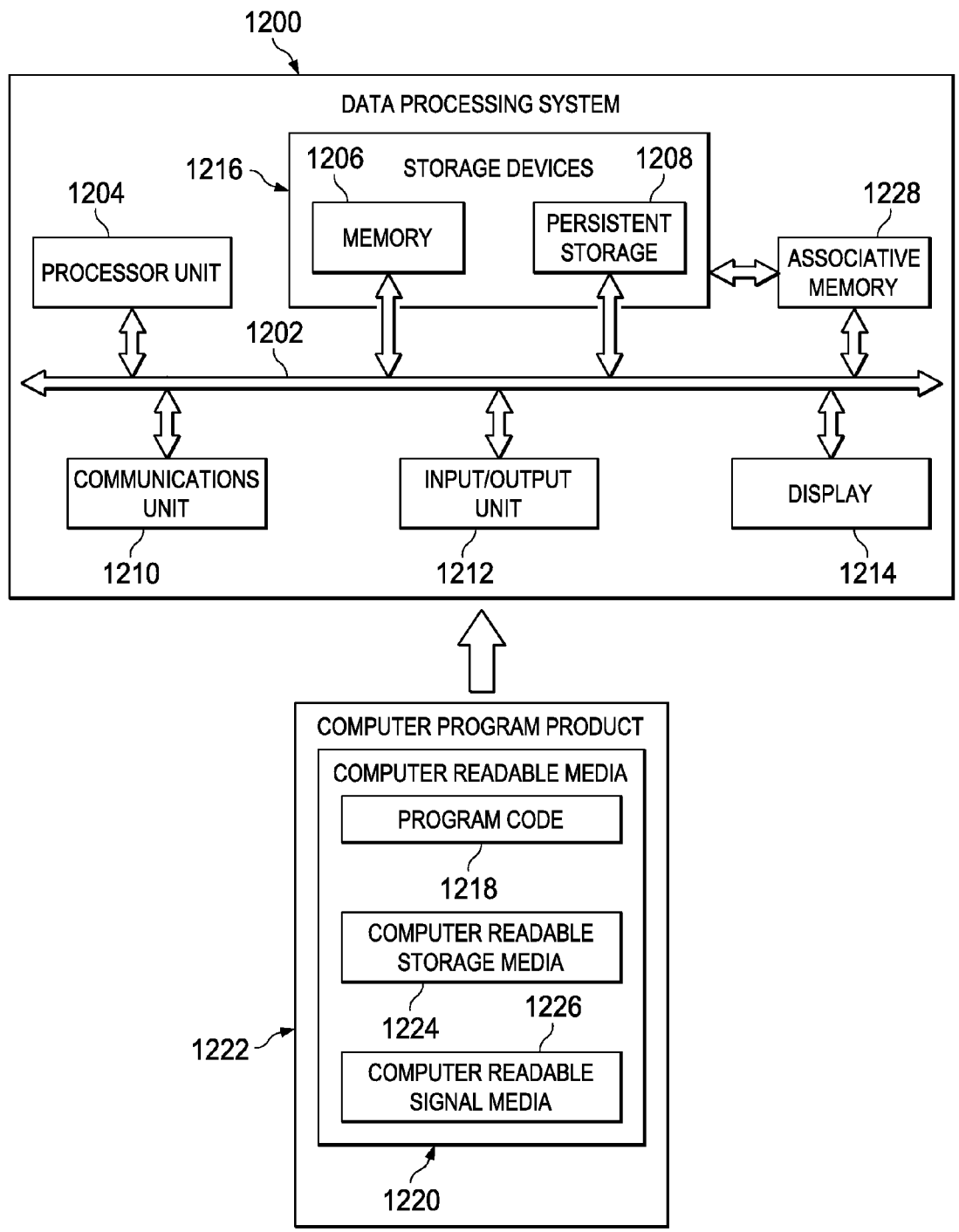
FIG. 12 is a block diagram illustrating a data processing system, in accordance with an illustrative embodiment.

Turning now to FIG. 12, an illustration of a data processing system is depicted in accordance with an illustrative embodiment. Data processing system 1200 in FIG. 12 is an example of a data processing system that may be used to implement the illustrative embodiments, such as system 300 of FIG. 3, or any other module or system or process disclosed herein. In this illustrative example, data processing system 1200 includes communications fabric 1202, which provides communications between processor unit 1204, memory 1206, persistent storage 1208, communications unit 1210, input/output (I/O) unit 1212, and display 1214.

Processor unit 1204 serves to execute instructions for software that may be loaded into memory 1206. Processor unit 1204 may be a number of processors, a multi-processor core, or some other type of processor, depending on the particular implementation. A number, as used herein with reference to an item, means one or more items. Further, processor unit 1204 may be implemented using a number of heterogeneous processor systems in which a main processor is present with secondary processors on a single chip. As another illustrative example, processor unit 1204 may be a symmetric multi-processor system containing multiple processors of the same type.

Memory 1206 and persistent storage 1208 are examples of storage devices 1216. A storage device is any piece of hardware that is capable of storing information, such as, for example, without limitation, data, program code in functional form, and/or other suitable information either on a temporary basis and/or a permanent basis. Storage devices 1216 may also be referred to as computer readable storage devices in these examples. Memory 1206, in these examples, may be, for example, a random access memory or any other suitable volatile or non-volatile storage device. Persistent storage 1208 may take various forms, depending on the particular implementation.

For example, persistent storage 1208 may contain one or more components or devices. For example, persistent storage 1208 may be a hard drive, a flash memory, a rewritable optical disk, a rewritable magnetic tape, or some combination of the above. The media used by persistent storage 1208 also may be removable. For example, a removable hard drive may be used for persistent storage 1208.

Communications unit 1210, in these examples, provides for communications with other data processing systems or devices. In these examples, communications unit 1210 is a network interface card. Communications unit 1210 may provide communications through the use of either or both physical and wireless communications links.

Input/output (I/O) unit 1212 allows for input and output of data with other devices that may be connected to data processing system 1200. For example, input/output (I/O) unit 1212 may provide a connection for user input through a keyboard, a mouse, and/or some other suitable input device. Further, input/output (I/O) unit 1212 may send output to a printer. Display 1214 provides a mechanism to display information to a user.

Instructions for the operating system, applications, and/or programs may be located in storage devices 1216, which are in communication with processor unit 1204 through communications fabric 1202. In these illustrative examples, the instructions are in a functional form on persistent storage 1208. These instructions may be loaded into memory 1206 for execution by processor unit 1204. The processes of the different embodiments may be performed by processor unit 1204 using computer implemented instructions, which may be located in a memory, such as memory 1206.

These instructions are referred to as program code, computer usable program code, or computer readable program code that may be read and executed by a processor in processor unit 1204. The program code in the different embodiments may be embodied on different physical or computer readable storage media, such as memory 1206 or persistent storage 1208.

Program code 1218 is located in a functional form on computer readable media 1220 that is selectively removable and may be loaded onto or transferred to data processing system 1200 for execution by processor unit 1204. Program code 1218 and computer readable media 1220 form computer program product 1222 in these examples. In one example, computer readable media 1220 may be computer readable storage media 1224 or computer readable signal media 1226. Computer readable storage media 1224 may include, for example, an optical or magnetic disk that is inserted or placed into a drive or other device that is part of persistent storage 1208 for transfer onto a storage device, such as a hard drive, that is part of persistent storage 1208. Computer readable storage media 1224 also may take the form of a persistent storage, such as a hard drive, a thumb drive, or a flash memory, that is connected to data processing system 1200. In some instances, computer readable storage media 1224 may not be removable from data processing system 1200.

Alternatively, program code 1218 may be transferred to data processing system 1200 using computer readable signal media 1226. Computer readable signal media 1226 may be, for example, a propagated data signal containing program code 1218. For example, computer readable signal media 1226 may be an electromagnetic signal, an optical signal, and/or any other suitable type of signal. These signals may be transmitted over communications links, such as wireless communications links, optical fiber cable, coaxial cable, a wire, and/or any other suitable type of communications link. In other words, the communications link and/or the connection may be physical or wireless in the illustrative examples.

In some illustrative embodiments, program code 1218 may be downloaded over a network to persistent storage 1208 from another device or data processing system through computer readable signal media 1226 for use within data processing system 1200. For instance, program code stored in a computer readable storage medium in a server data processing system may be downloaded over a network from the server to data processing system 1200. The data processing system providing program code 1218 may be a server computer, a client computer, or some other device capable of storing and transmitting program code 1218.

The different components illustrated for data processing system 1200 are not meant to provide architectural limitations to the manner in which different embodiments may be implemented. The different illustrative embodiments may be implemented in a data processing system including components in addition to or in place of those illustrated for data processing system 1200. Other components shown in FIG. 12 can be varied from the illustrative examples shown. The different embodiments may be implemented using any hardware device or system capable of running program code. As one example, the data processing system may include organic components integrated with inorganic components and/or may be comprised entirely of organic components excluding a human being. For example, a storage device may be comprised of an organic semiconductor.

In another illustrative example, processor unit 1204 may take the form of a hardware unit that has circuits that are manufactured or configured for a particular use. This type of hardware may perform operations without needing program code to be loaded into a memory from a storage device to be configured to perform the operations.

For example, when processor unit 1204 takes the form of a hardware unit, processor unit 1204 may be a circuit system, an application specific integrated circuit (ASIC), a programmable logic device, or some other suitable type of hardware configured to perform a number of operations. With a programmable logic device, the device is configured to perform the number of operations. The device may be reconfigured at a later time or may be permanently configured to perform the number of operations. Examples of programmable logic devices include, for example, a programmable logic array, programmable array logic, a field programmable logic array, a field programmable gate array, and other suitable hardware devices. With this type of implementation, program code 1218 may be omitted because the processes for the different embodiments are implemented in a hardware unit.

In still another illustrative example, processor unit 1204 may be implemented using a combination of processors found in computers and hardware units. Processor unit 1204 may have a number of hardware units and a number of processors that are configured to run program code 1218. With this depicted example, some of the processes may be implemented in the number of hardware units, while other processes may be implemented in the number of processors.

As another example, a storage device in data processing system 1200 is any hardware apparatus that may store data. Memory 1206, persistent storage 1208, and computer readable media 1220 are examples of storage devices in a tangible form.

In another example, a bus system may be used to implement communications fabric 1202 and may be comprised of one or more buses, such as a system bus or an input/output bus. Of course, the bus system may be implemented using any suitable type of architecture that provides for a transfer of data between different components or devices attached to the bus system. Additionally, a communications unit may include one or more devices used to transmit and receive data, such as a modem or a network adapter. Further, a memory may be, for example, memory 1206, or a cache, such as found in an interface and memory controller hub that may be present in communications fabric 1202.

Data processing system 1200 may also include associative memory 1228. Associative memory 1228 may be associative memory 302 of FIG. 3, and may have the properties described elsewhere herein. Associative memory 1228 may be in communication with communications fabric 1202. Associative memory 1228 may also be in communication with, or in some illustrative embodiments, be considered part of storage devices 1216. While one associative memory 1228 is shown, additional associative memories may be present.

The different illustrative embodiments can take the form of an entirely hardware embodiment, an entirely software embodiment, or an embodiment containing both hardware and software elements. Some embodiments are implemented in software, which includes but is not limited to forms such as, for example, firmware, resident software, and microcode.

Furthermore, the different embodiments can take the form of a computer program product accessible from a computer usable or computer readable medium providing program code for use by or in connection with a computer or any device or system that executes instructions. For the purposes of this disclosure, a computer usable or computer readable medium can generally be any tangible apparatus that can contain, store, communicate, propagate, or transport the program for use by or in connection with the instruction execution system, apparatus, or device.

The computer usable or computer readable medium can be, for example, without limitation an electronic, magnetic, optical, electromagnetic, infrared, or semiconductor system, or a propagation medium. Non-limiting examples of a computer readable medium include a semiconductor or solid state memory, magnetic tape, a removable computer diskette, a random access memory (RAM), a read-only memory (ROM), a rigid magnetic disk, and an optical disk. Optical disks may include compact disk-read only memory (CD-ROM), compact disk-read/write (CD-R/W), and DVD.

Further, a computer usable or computer readable medium may contain or store a computer readable or usable program code such that when the computer readable or usable program code is executed on a computer, the execution of this computer readable or usable program code causes the computer to transmit another computer readable or usable program code over a communications link. This communications link may use a medium that is, for example without limitation, physical or wireless.

A data processing system suitable for storing and/or executing computer readable or computer usable program code will include one or more processors coupled directly or indirectly to memory elements through a communications fabric, such as a system bus. The memory elements may include local memory employed during actual execution of the program code, bulk storage, and cache memories which provide temporary storage of at least some computer readable or computer usable program code to reduce the number of times code may be retrieved from bulk storage during execution of the code.

Input/output or I/O devices can be coupled to the system either directly or through intervening I/O controllers. These devices may include, for example, without limitation, keyboards, touch screen displays, and pointing devices. Different communications adapters may also be coupled to the system to enable the data processing system to become coupled to other data processing systems or remote printers or storage devices through intervening private or public networks. Non-limiting examples of modems and network adapters are just a few of the currently available types of communications adapters.

The description of the different illustrative embodiments has been presented for purposes of illustration and description, and is not intended to be exhaustive or limited to the embodiments in the form disclosed. Many modifications and variations will be apparent to those of ordinary skill in the art. Further, different illustrative embodiments may provide different features as compared to other illustrative embodiments. The embodiment or embodiments selected are chosen and described in order to best explain the principles of the embodiments, the practical application, and to enable others of ordinary skill in the art to understand the disclosure for various embodiments with various modifications as are suited to the particular use contemplated.

What is claimed is:

1. A system comprising:
an associative memory comprising a plurality of data and a plurality of associations among the plurality of data, wherein the plurality of data is collected into associated groups, wherein the associative memory is configured to be queried based on at least indirect relationships among the plurality of data;
a first input device in communication with the associative memory, the first input device configured to receive a first attribute value relating to a corresponding attribute of a subject of interest to a user;
a processor, in communication with the first input device, and configured to generate a first entity using the first attribute value;
the associative memory configured to perform an analogy query using the first entity to retrieve a second entity having a second attribute value that matches the first attribute value of the first entity; and
the associative memory further configured to cluster first data in the first entity and second data in the second entity.

2. The system of claim 1, wherein the first entity comprises a virtual entity.

3. The system of claim 2, wherein the virtual entity comprises an imaginary entity conceived by the user, and wherein the virtual entity has no real existence.

4. The system of claim 3, wherein the virtual entity comprises an object having ideal properties not achievable in real existence.

5. The system of claim 4, wherein the virtual entity comprises a flawless solution to a problem related to the virtual entity.

6. The system of claim 5, wherein the second entity comprises at least one real solution to the problem.

7. The system of claim 6, wherein the associative memory is configured to produce clustered data as a result of clustering, and wherein the system further comprises:
a display device in communication with the associative memory, the display device configured to display the clustered data such that attributes of the real solution are visibly compared to attributes of the flawless solution.

8. The system of claim 1, wherein the first input device is configured to receive one or both of structured data and unstructured data.

9. The system of claim 1, wherein the first attribute value comprises a plurality of attribute values, wherein the associative memory is further configured to select which attributes of the plurality of attribute values to use in generating the first entity according to a hierarchical structure present in the associative memory.

10. The system of claim 1, wherein the first input device is further configured receive comparison criteria and wherein the associative memory is further configured to modify which attributes the associative memory uses in generating the first entity.

11. A method implemented using a processor in conjunction with an associative memory embodied as a program code on a non-transitory computer readable storage medium, wherein the associative memory comprises a plurality of data and a plurality of associations among the plurality of data, wherein the plurality of data is collected into associated groups, wherein the associative memory is configured to be queried based on at least indirect relationships among the plurality of data, the method comprising:
receiving, in the associative memory, a first entity whose attribute value relates to a corresponding attribute of a subject of interest to a user;
performing, using the associative memory and the processor, an analogy query using the first entity to retrieve a second entity whose attributes match some attributes of the first entity; and
clustering, using the associative memory and the processor, first data in the first entity and second data in the second entity.

12. The method of claim 11, wherein the entity comprises a virtual entity, wherein the first entity comprises an inserted entity, and wherein the method further comprises:
removing the inserted entity from the associative memory.

13. The method of claim 12, wherein the virtual entity comprises an object having ideal properties not achievable in real existence.

14. The method of claim 12, wherein the second entity comprises at least one real solution to a problem.

15. The method of claim 14, wherein the associative memory is configured to produce clustered data as a result of clustering, and wherein the method further comprises:
displaying, on a display device, the clustered data such that attributes of the real solution are visibly compared to attributes of the virtual entity.

16. A computer comprising:
a processor;
a bus connected to the processor;
a non-transitory computer readable storage medium connected to the bus, the non-transitory computer readable storage medium storing an associative memory comprising a plurality of data and a plurality of associations among the plurality of data, wherein the plurality of data is collected into associated groups, wherein the associative memory is configured to be queried based on at least indirect relationships among the plurality of data, wherein the non-transitory computer readable storage medium further stores program code comprising:
program code configured to receive, in the associative memory, a first entity whose attribute value relates to a corresponding attribute of a subject of interest to a user;
program code configured to perform, using the associative memory and the processor, an analogy query using the first entity to retrieve a second entity, whose attributes match some attributes of the first entity; and program code configured to cluster, using the associative memory and the processor, first data in the first entity and second data in the second entity.

17. The computer of claim 16, wherein the first entity comprises a virtual entity, wherein the first entity comprises an inserted entity, and wherein the program code further comprises:

program code configured to remove the inserted entity from the associative memory.

18. The computer of claim 17, wherein the virtual entity comprises an object having ideal properties not achievable in real existence.

19. The computer of claim 17, wherein the second entity comprises at least one real solution to a problem.

20. The computer of claim 19, wherein the associative memory is configured to produce clustered data as a result of clustering, and wherein the program code further comprises:

program code configured to display, on a display device, the clustered data such that attributes of the real solution are visibly compared to attributes of the virtual entity.

* * * * *